(12) United States Patent
Wang et al.

(10) Patent No.: US 12,158,490 B2
(45) Date of Patent: Dec. 3, 2024

(54) NON-INVASIVE FRONT-END FOR POWER ELECTRONIC MONITORING

(71) Applicant: Aalborg Universitet, Aalborg Ø (DK)

(72) Inventors: Huai Wang, Aalborg (DK); Yingzhou Peng, Aalborg (DK)

(73) Assignee: Aalborg Universitet, Aalborg Ø (DK)

( * ) Notice: Subject to any disclaimer, the term of this patent is extended or adjusted under 35 U.S.C. 154(b) by 23 days.

(21) Appl. No.: 17/918,141

(22) PCT Filed: Apr. 13, 2021

(86) PCT No.: PCT/DK2021/050101
§ 371 (c)(1),
(2) Date: Oct. 11, 2022

(87) PCT Pub. No.: WO2021/209101
PCT Pub. Date: Oct. 21, 2021

(65) Prior Publication Data
US 2023/0132796 A1    May 4, 2023

(30) Foreign Application Priority Data

Apr. 14, 2020 (DK) .......................... PA 2020 70231
Apr. 15, 2020 (DK) .......................... PA 2020 70235

(51) Int. Cl.
*G01R 31/26* (2020.01)
*G01R 31/327* (2006.01)

(52) U.S. Cl.
CPC ..... *G01R 31/2617* (2013.01); *G01R 31/3277* (2013.01)

(58) Field of Classification Search
CPC ............... G01R 31/42; G01R 31/2617; G01R 31/2619; G01R 31/3277; G01R 19/0084; H02M 7/53871; H03K 17/18
See application file for complete search history.

(56) References Cited

U.S. PATENT DOCUMENTS 9,793,835 B2    10/2017  Fujie
2010/0164597 A1*  7/2010  Steensgaard-Madsen ..................
                                       H03K 17/063
                                            327/390

(Continued)

FOREIGN PATENT DOCUMENTS

CN      110174603 A    8/2019

OTHER PUBLICATIONS

Davari, Pooya; Kristensen, Ole Damm; Iannuzzo, Francesco; Investigation of acoustic emission as a non-invasive method for detection of power semiconductor aging, 2018, Aalborg University Denmark, pp. 1-8.

(Continued)

*Primary Examiner* — Thang X Le
(74) *Attorney, Agent, or Firm* — Woodard, Emhardt, Henry, Reeves & Wagner, LLP

(57) ABSTRACT

A front-end device for monitoring operation of an associated electric power device with semiconductor power switches generating a power output, e.g. a three-phase power output. The front-end device has input terminals arranged for connection to the electric phase(s) of the power output of the associated electric power device, and an electric circuit connected to the input terminals and connected to at set of output terminals. The electric circuit has a passive interconnection comprising electric semiconductor switches and diodes. The electric circuit serves to electrically block any high voltage component from the input terminals from reaching the output terminals, while allowing an on-state voltage of at least one semiconductor power switch in the associated electric power device to pass to the at least two output terminals. The front-end allows low voltage equipment to be connected to its output terminals for determining an on-state voltage of switches of the electric power device. Especially, embodiments with self-powered reference volt- (Continued)

age circuits provided by zener diodes allow compact low cost versions for use in e.g. portable test equipment or as part of permanently installed health condition monitoring of power devices. The front-end device can be used as a simple and low cost solution for non-invasive health condition monitoring of power devices, e.g. power converters in such as power electric generation system or electric vehicles. Such monitoring allows predictive maintenance to be performed to avoid any faults in the power device that may cause permanent damages.

17 Claims, 12 Drawing Sheets

(56) References Cited

U.S. PATENT DOCUMENTS

| | | | |
|---|---|---|---|
| 2013/0033909 A1* | 2/2013 | Jones | H03K 17/0812 361/91.5 |
| 2013/0120030 A1 | 5/2013 | Kora | |
| 2013/0320778 A1* | 12/2013 | Hopf | H02H 3/02 307/130 |
| 2014/0049870 A1 | 2/2014 | Fujikawa | |
| 2015/0301103 A1 | 10/2015 | Das | |
| 2017/0222573 A1* | 8/2017 | Granig | H02M 7/217 |
| 2018/0367137 A1 | 12/2018 | Arribas | |
| 2019/0334452 A1* | 10/2019 | Hattori | H02M 7/5387 |
| 2019/0386654 A1* | 12/2019 | Norling | H03K 17/0826 |
| 2020/0195168 A1* | 6/2020 | Gloes | H02M 7/487 |

OTHER PUBLICATIONS

International Search Report and Written Opinion issued in related PCT/DK2021/050101 on Jul. 5, 2021 (pp. 12).

Macine translation of CN110174603A by PatDocs on Oct. 6, 2022 (pp. 12).

Mohannad Jabbar Mnati, Alex Van Den Bossche, Raad Farhood Chisab, A Smart Voltage and Current Monitoring System for Smartphone Application, Sensors 2017, pp. 1-16.

Yingzhou Peng, Yanfeng Shen, Huai Wang, A Condition Monitoring Method for Three Phase Inverter Based on System-Level Signal, 2018, Aalborg University, Denmark, pp. 1-5.

* cited by examiner

NON-INVASIVE FRONT-END FOR POWER ELECTRONIC MONITORING

FIELD OF THE INVENTION

The present invention relates to the field of power electronics. More specifically, the invention relates to the field of monitoring of power electronics, such as health condition monitoring. Especially, the invention provides a non-invasive front-end for determining on-state voltage of power semiconductors in power electronics, e.g. of a three-phase power semiconductor module, such as for health condition monitoring and fault detection in a power semiconductor module.

BACKGROUND OF THE INVENTION

Power electronics based on semiconductor devices, such as in power converter systems for various power electric application, are vulnerable components. In general such as humidity, salinity or high temperatures can cause a power semiconductor, e.g. IGBTs, MOSFETS and diodes, in power devices to fail.

Faults can be fatal with respect to large damage of components causing e.g. an electric train or a power plant to stop functioning. In case of high power systems, faults may cause severe damages that can even compromise person safety. Without any monitoring that can detect abnormal behaviour of the power device, unexpected failures may be expected, and the risk for this can only be reduced by an increased design margin, which means increased costs and increased size of the power device.

Online health condition monitoring systems are often complicated and need to be built into the semiconductor devices, e.g. systems with a temperature sensor serving to measure junction temperature for the most sensitive semiconductor components, or dedicated and complicated built-in condition monitoring systems specially designed for a specific semiconductor device and involves measurement of electric signals or temperature at chip level.

Thus, it is a problem that existing health condition monitoring of power devices are invasive and often even requires the system to be built-in in the manufacturing of the power device.

SUMMARY OF THE INVENTION

Thus, according to the above description, it is an object of the present invention to provide a non-invasive way of condition monitoring electric power devices which is suited also for high voltage power devices, e.g. providing a power output of above 1 kV.

The invention provides a front-end device for monitoring operation of an associated electric power device with semiconductor power switches generating a power output with at least one electric phase, the front-end device comprising at least two input terminals arranged for connection to the at least one electric phase of the power output of the associated electric power device, at least two output terminals, and an electric circuit connected between the at least two input terminals and the at least two output terminals, wherein the electric circuit comprises a (e.g. passive) interconnection comprising electric semiconductor switches and diodes, wherein the electric circuit serves to electrically block any high voltage component from reaching the at least two output terminals, while allowing an on-state voltage of at least one semiconductor power switch in the associated electric power device to pass to the at least two output terminals. The invention is based on the insight that on-state voltages of power semiconductor components can be measured based on the three-phase output of the power device, i.e. non-invasively, and by means of simple circuit elements with only two low voltage electric output terminals, the device can generate a direct input to a computer system to perform a monitoring algorithm. This allows online monitoring by generating a direct input to a monitoring system of a power system, or as input to a laptop computer for on-site recording of the electric outputs from the device to instant monitoring or for recording for later analysis. It is known that on-state voltage develop over time for a semiconductor switch due to ageing, and thus on-state voltage is a valuable measure with respect to health state of the semiconductor switch.

Thus, such front-end device for health monitoring of an electric power semiconductor device is advantageous, since the design is simple and can be implemented with low cost components in compact dimensions, even though the on-state voltage to be measured is typically such as 1-3 V, whereas operating voltage may be 1 kV or more. It is suitable for online health condition monitoring since the device allows e.g. estimation of junction temperatures in semiconductor components of the monitored power device based on a measured on-state voltage. This allows a reduced risk of break-down due to faults, i.e. safer operation, and further gradual degradation of power devices can be detected and allows predictive maintenance.

The device can be retro-fitted as online health monitoring to improve safety for existing power devices, since fault or damages can be avoided. Further, the design margin for the power devices may be relaxed, and a higher electric efficiency can be obtained from a power device, since online monitoring allows detection of faults at an early state to avoid damages.

The device is capable of detecting both over-temperatures of semiconductor devices as well as changes due to degradation of the semiconductor device. This allows actions such as: a) completely shutting down the system, b) de-rating the power output of the system, or c) providing input to predictive maintenance of the system.

The compact dimensions of the monitoring device allows it to for use as a stand-alone transportable health monitoring device for inspection and maintenance check of power devices.

Various embodiments and preferred features will be described in the following.

In preferred embodiments, a pair of diodes serve to electrically block high voltage from reaching the at least two output terminals. Especially, the pair of diodes each comprises a series connection of a plurality of diodes, which hereby allowing a series of diodes with a moderate voltage rating to handle a high operating voltage. In other versions, a set of one or more diodes are used to block positive and negative high voltages.

Preferred embodiments comprise at least one zener diode with a zener voltage exceeding an expected on-state voltage of said semiconductor power switch, i.e. expected on-stage voltage depending on the actual power switch technology, such as within the range 0.5-5 V, more typically within 1-3 V. The zener diode is preferably connected so in relation to the high voltage blocking diodes to allow the on-state voltage to pass to the least two output terminals, thereby allowing the on-state voltage to be determined by measuring voltage at the at least two output terminals without the presence of a high voltage component at any time. This allows use of low cost measurement equipment for quantifying the on-state voltage for further condition monitoring analysis. The same objective can be obtained by means of a reference voltage source arranged to provide a reference DC voltage exceeding an expected on-state voltage of said semiconductor power switch, however such reference source adds costs and requires a separate power source. In this respect, the zener diode solution can be considered as a self-powering solution. In preferred circuit designs, at least two zener diodes with zener voltages exceeding an expected on-state voltage of said semiconductor power switch are used, e.g. allowing quantification of on-state voltages of both power switches operating at positive and negative voltages. In a preferred embodiment, a zener diode is connected as part of a self-power circuit for connection to at least two of the at least two input terminals, wherein the self-power circuit comprises a high-voltage blocking capacitor connected at an input to a diode-based rectifier, and wherein the zener diode is connected between output terminals of the self-power circuit in parallel with a capacitor. Specifically, the self-power circuit may have a first mode of operation wherein the capacitor in parallel with the zener diode is in a charging stage, when a voltage at the input terminals of the self-power circuit is changed from the on-state voltage to plus or minus a high DC voltage. Specifically, the self-power circuit may further have a second mode of operation wherein the capacitor in parallel with the zener diode is in a discharging stage, when a voltage at the input terminals of the self-power circuit is either the on-state voltage or at a high DC voltage.

In preferred embodiments, the front-end device comprises a galvanic isolation stage to allow galvanic isolation between the at least two input terminals and the at least two output terminals. Especially, the galvanic isolation stage comprises an isolated amplifier connected between an output of an on-state voltage measurement stage and the at least two output terminals. Especially, the front-end device may comprise a self-power circuit connected to two of the at least two input terminals, and connected to provide electric power for powering the isolated amplifier via at least one transformer, such as via two transformers. Such embodiments can be implemented which are self-powered and provide galvanic isolation up to a given voltage limit, e.g. above 1 kVrms, such as 1-5 kVrms, such as 1-20 kVrms or above 20 kVrms. More specifically, the front-end device may be arranged with input terminals arranged for connection to a three-phase device. This allows the front-end device to be used as well as for on-stage measurement of on-stage voltages of low, medium and high voltage devices such as inverters/converter etc.

In a preferred embodiment, the front-end device has at least three input terminals arranged for connection to respective three electric phases of the power output of the associated electric power device, and at least two or three output terminals, wherein an electric circuit connected between the at least three input terminals and the two or three output terminals comprises an interconnection (e.g. passive) comprising electric semiconductor switches and diodes, wherein the electric circuit serves to electrically block any high voltage component from reaching the two or three output terminals, while allowing an on-state voltage of at least one semiconductor power switch in the associated electric power device to pass to the two or three output terminals in order to allow determining on-state voltages for each of the three electric phases of the power output of the associated electric power device.

In a front-end device embodiment, the front-end device comprises a housing enclosing the electric circuit, wherein the at least two input terminals are accessible from outside the housing. Especially, the at least two output terminals may be accessible from outside the housing, so as to allow analog measurements to be performed by measurement equipment. In other embodiments, the housing further encloses an analog-to-digital converter system connected to the at least two output terminals inside the housing to convert measured voltage(s) at the at least two output terminals to digital signal(s), and wherein such digital signal(s) are provided at a digital interface accessible from outside the housing, so as to allow e.g. a laptop computer, tablet, or dedicated processor equipment to be connected to the frond-end device.

In a second aspect, the invention provides a condition monitoring system for monitoring operation of an associated electric power device with semiconductor power switches generating a power output with at least one electric phase, the system comprising a front-end device according to the first aspect, and
an analysis system comprising a processor system and being arranged for connection to the at least two output terminals of the front-end device, and further being arranged to determine an on-state voltage level of at least one semiconductor power switch in the associated electric power device in response to electric signals measured at the at least two output terminals of the frond-end device, and to generate an output indicative of said on-state voltage level accordingly.

Preferred embodiments comprises at least one analog-to-digital converter connected to the at least two output terminals of the frond-end device, and being arranged to generate a digital output signal in accordance with a voltage across the at least two output terminals. In three-phase versions, one analog-to-digital converter is preferably provided to measure respective digital output signals indicative of on-state voltages for the respective phases.

The analysis system may be arranged to monitor at least one on-state voltage level over time for the associated electric power device. This allows monitoring of on-state voltage level of each power switch component over time, thus allowing the condition monitoring system to determine any abnormal behaviour apart from the expected change of on-state voltage level as a function of ageing. This can be done with a permanent installation that continuously monitors an electric power device and e.g. is capable of providing an alarm, if the monitored on-state voltage(s) exceeds a preset threshold value. Alternatively, the condition monitoring system can be in the form of a portable test equipment that allows service personnel to visit an installation with the electric power device at regular intervals and note any abnormal on-state voltage(s). Both of such approaches can allow observation of any abnormal behaviour of the electric power device at an early state towards development of a defect function. Thus, it allows predictive maintenance, e.g. replacement of an electric power component with abnormal on-state voltage(s), before any malfunction causing breakdown or even permanent damage of other equipment or compromising person safety.

The condition monitoring system implemented as a portable equipment. Alternatively, the condition monitoring system is implemented as a system arranged for installation for continuous monitoring of the associated electric power device, e.g. integrated with the control system of an electric power installation.

In some embodiments, the front-end device is integrated into the associated electric power device, i.e. within the same housing, and e.g. with parts of the frond-end device on the same chip as parts of the power switches of the electric power device. Especially, a digital interface, wired or wireless, allows connection to further equipment outside the housing of the electric power device. Especially, at least part of the analysis system is integrated with a system generating or receiving electric power from the associated electric power device. Such system may be a renewable electric power plant, or an electric vehicle, an electric train or the like.

In preferred embodiments, the condition monitoring system comprises a front-end device arranged to determine an on-state voltage level of at least one semiconductor power switch for each of the three electric phases of the associated electric power device in response to electric signals measured at the two or three output terminals of the frond-end device, and wherein the analysis system is arranged to generate an output indicative of said on-state voltage levels accordingly.

In a third aspect, the invention provides a method for determining on-state voltage of a semiconductor power switch of an associated power device, the method comprising
  providing an electric circuit comprising at least two input terminals connected to a plurality of interconnected electric semiconductor switches and diodes further connected to the at least two output terminals, wherein the electric circuit serves to block a high voltage at the at least two input terminals from reaching the at least two output terminals,
  connecting the at least two input terminals to at least one phase of an electric output of the associated power device,
  detecting electric signals at the at least two output terminals,
  analysing the electric signals at the at least two output terminals,
  generating, based on the analysis, an output to a user indicative of on-state voltage of at least one semiconductor power switch of the associated electric power device.

The method may comprise determining on-state voltages of semiconductor power switches of an associated electric three-phase power device, the method comprising
  providing an electric circuit comprising three input terminals connected to a plurality of interconnected electric semiconductor switches and diodes further connected to the at least two output terminals,
  connecting the three input terminals to the respective phases of the three-phase outputs of the associated power device,
  detecting electric signals at the at least two output terminals,
  analysing the electric signals at the at least two output terminals,
  generating, based on the analysis, an output to a user indicative of on-state voltages of semiconductor power switches for each of the three phases of the associated electric three-phase power device.

In a fourth aspect, the invention provides a system comprising
  an electric power device comprising a power output with at least one electric phase,
  the front-end device according to the first aspect, wherein the at least two input terminals are connected to at least one electric phase of power output of the electric power device.

The system may further comprise the condition monitoring system according to the second aspect.

The system may especially be an electric vehicle, a power generation system, an electric motor drive system, a traction motor system, an aircraft.

In a fifth aspect, the invention provides use of the front-end device according to the first aspect for health condition monitoring of an electric power device.

In a sixth aspect, the invention provides use of the front-end device according to the first aspect for health condition monitoring of one of: an electric vehicle, a power generation system, an electric motor drive system, a traction motor system, an aircraft.

It is appreciated that the described embodiments and features for the mentioned aspects can be intermixed in any way.

BRIEF DESCRIPTION OF THE FIGURES

The invention will now be described in more detail with regard to the accompanying figures of which

The figures illustrate specific ways of implementing the present invention and are not to be construed as being limiting to other possible embodiments falling within the scope of the attached claim set.

DETAILED DESCRIPTION OF THE INVENTION

Figure 1:
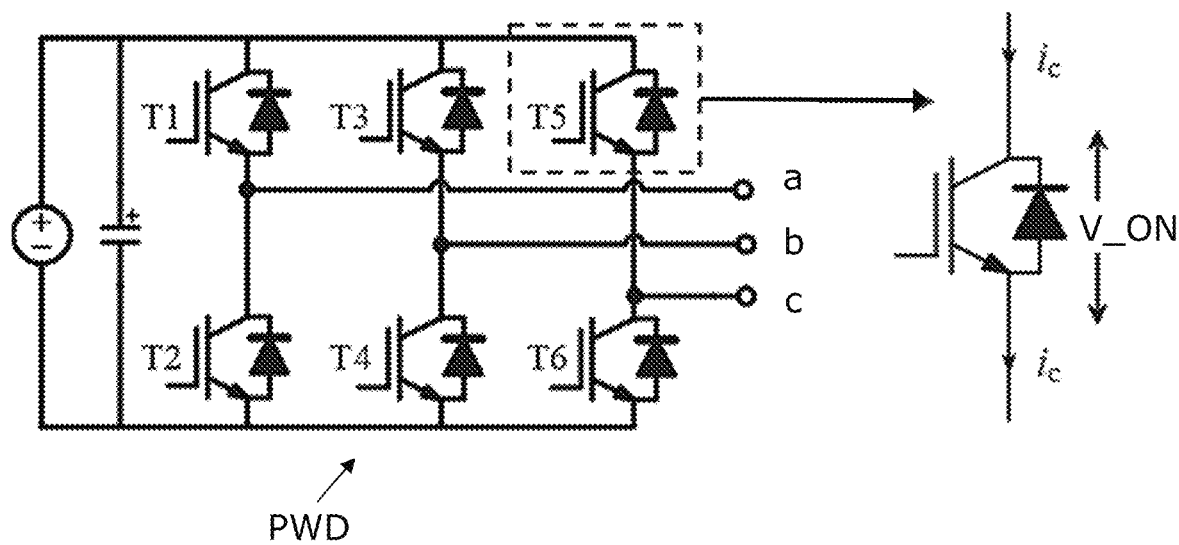
FIG. 1 illustrates an example of an electric power device with semiconductor switches each providing, in their conducting on-state, an on-state voltage.

FIG. 1 illustrates an example of an electric power device PWD with a three-phase set of output terminals a, b, and c. The electric power device PWD is here illustrated with a DC voltage, e.g. a high or medium voltage, which is applied to a switching circuit with three sets of semiconductor switches T1-T6, one set for each phase. Each switch T1-T6 provides, as illustrated for switch T5 to the right, an on-state voltage V_ON when the switch is in its conducting on-state, i.e. when the switch conducts a current $i_c$. Further, the freewheeling diode on-state voltage may further be measured. As known in the art, this on-state voltage V_ON can be used as indicator for the health condition of the semiconductor switch T1-T6. Depending on the semiconductor technology, the on-state voltage V_ON has an expected specific level, e.g. a voltage of typically 1-3 V, depending on technology. It is known that the on-state voltage level for a power switch increases with ageing. Thus, monitoring on-state voltage over time can be used for health condition monitoring of an electric power device PWD.

The invention relates to a simple and low cost front-end device for measuring on-state voltage based on connection to the output terminals a, b, c of the power device PWD, i.e. terminals normally accessible from outside the power device PWD. Even though the operating voltage of the power device PWD exceeds e.g. 1 kV, the front-end device is capable of converting the electric outputs a, b, c into a low voltage output for precise quantification of the on-state voltage V_ON for non-invasive health condition monitoring.

Figure 2:
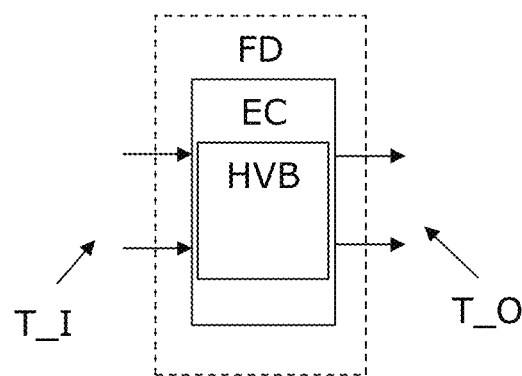
FIG. 2 illustrates a block diagram of a front-end device embodiment.

FIG. 2 illustrates a simple block diagram of a front-end device FD embodiment for monitoring operation of an associated electric power device with semiconductor power switches generating a power output with at least one electric phase. The front-end device FD has a set of at least two input terminals T_I arranged for connection to the one or more electric phase of the power output of the associated electric power device. E.g. referring to power device PWD of FIG. 1, the input terminals T_I may be arranged for connection to terminal a and electric ground. The front-end device converts the high voltage signal received at the input terminals T_I into a low voltage signal at a set of output terminals T_O. This is done by means of an electric circuit EC. The electric circuit EC comprises a high voltage blocking circuit HVB with a passive interconnection of electric semiconductor switches and diodes connected so as to electrically block any high voltage component from reaching the output terminals T_O. At the same time, the electric circuit EC is functionally connected so as to allow the on-state voltage of at least one semiconductor power switch in the electric power device to pass to the output terminals T_O.

Thus, by means of rather simple circuit elements, the front-end device FD allows a measurement device connected to the output terminals T_O to precisely measure the on-state voltage at a system-level—i.e. to allow on-state voltage measurements with a non-invasive method, based on electric terminals which are normally accessible. Especially, the front-end device FD allow use of a low voltage measurement device, i.e. without the need to be rated for high or medium voltage levels normally involved with high power electric devices.

In some embodiments, the electric circuit EC comprises a reference voltage source to provide a fixed voltage selected depending on the expected on-state voltage to measure. In most preferred "self-powering" embodiments, this fixed voltage can be provided by means of a zener diode arrangement.

Figure 3A:
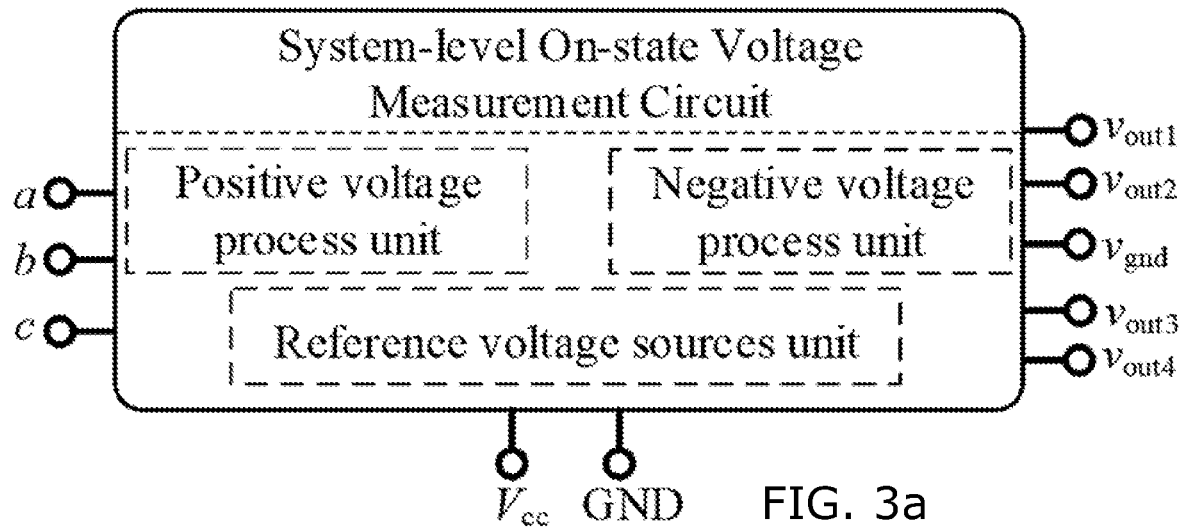
FIGS. 3a-3c illustrate various examples of basic front-end device embodiments for three-phase measurements.
Figure 3B:
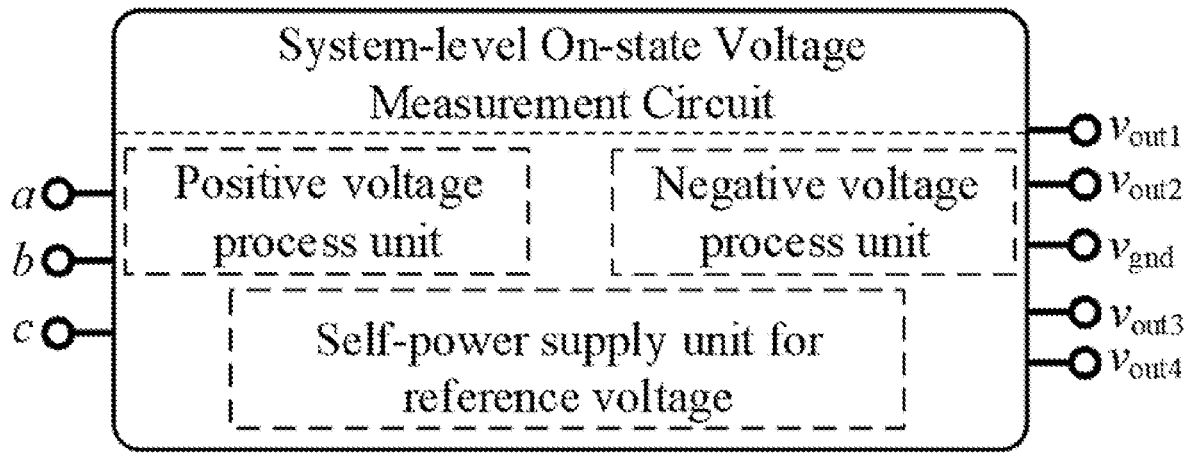
Figure 3C:
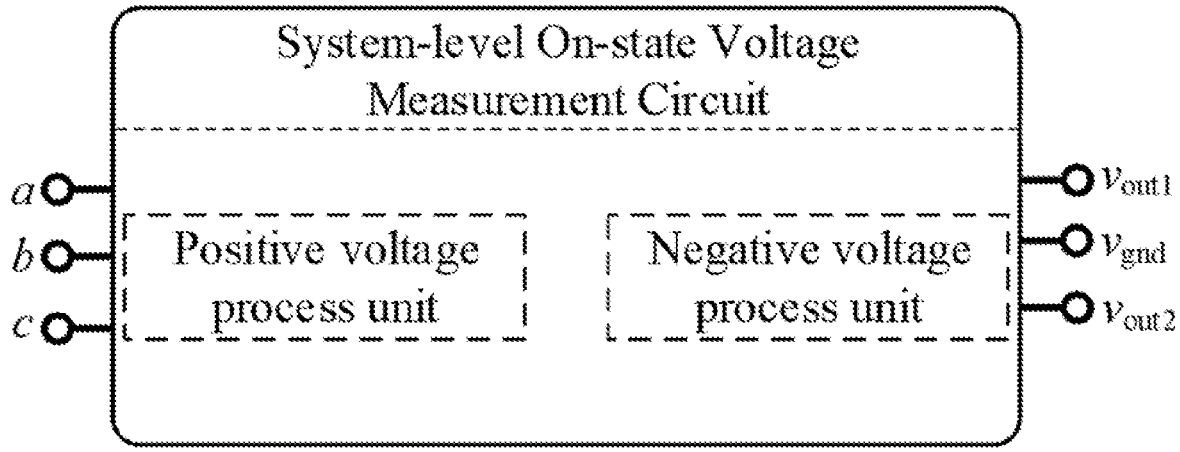

FIGS. 3a-3c illustrate various examples of basic front-end device embodiments for three-phase measurements.

FIG. 3a illustrates an embodiment with three input terminals a, b, c for respective electric phases, an electric ground terminal GND, as well as a reference voltage input terminal Vcc for connection of an external reference voltage source. The electric circuit has a positive and negative processing unit to allow providing positive and negative voltage outputs at output terminals vout1, vout2, vout3, vout4, and vgnd, so as to allow positive and negative voltage measurements for all three electric phase inputs a, b, c.

FIG. 3b illustrates an embodiment differing from the embodiment of FIG. 3a only with the fact that the reference voltage input terminals are eliminated, since the electric circuit has passive electric circuit components providing a self-powered reference voltage, thereby providing a simple solution without any expensive external power source.

FIG. 3c illustrates a simple embodiment differing from the embodiment of FIG. 3b in that it has only three output terminals vout1, vout2, and vgnd.

Figure 4A:
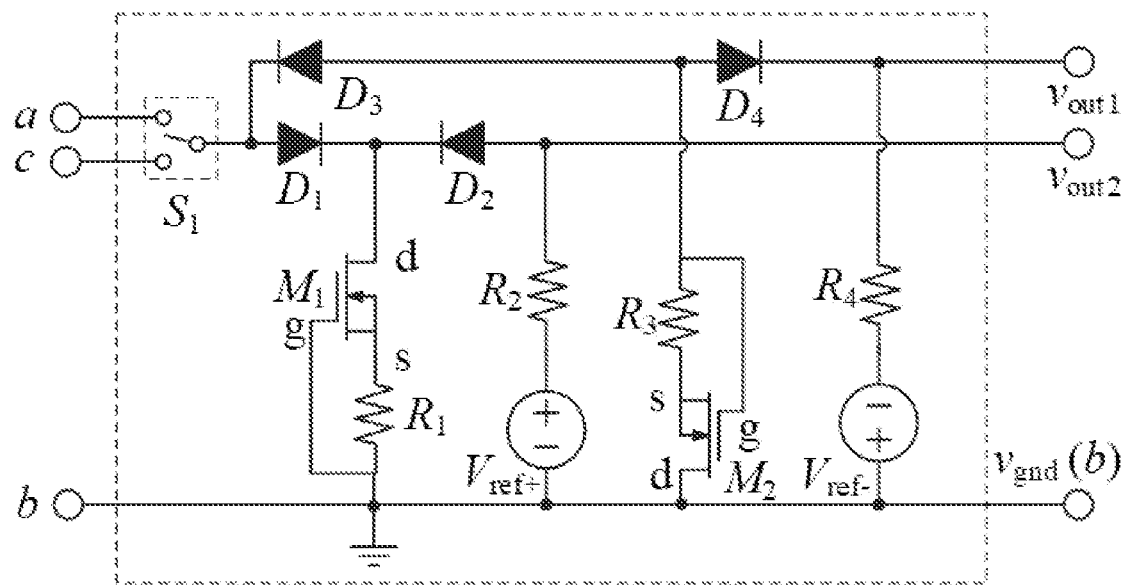
FIGS. 4a-4c illustrate circuit diagrams for front-end device embodiments based on an external reference voltage source.
Figure 4B:
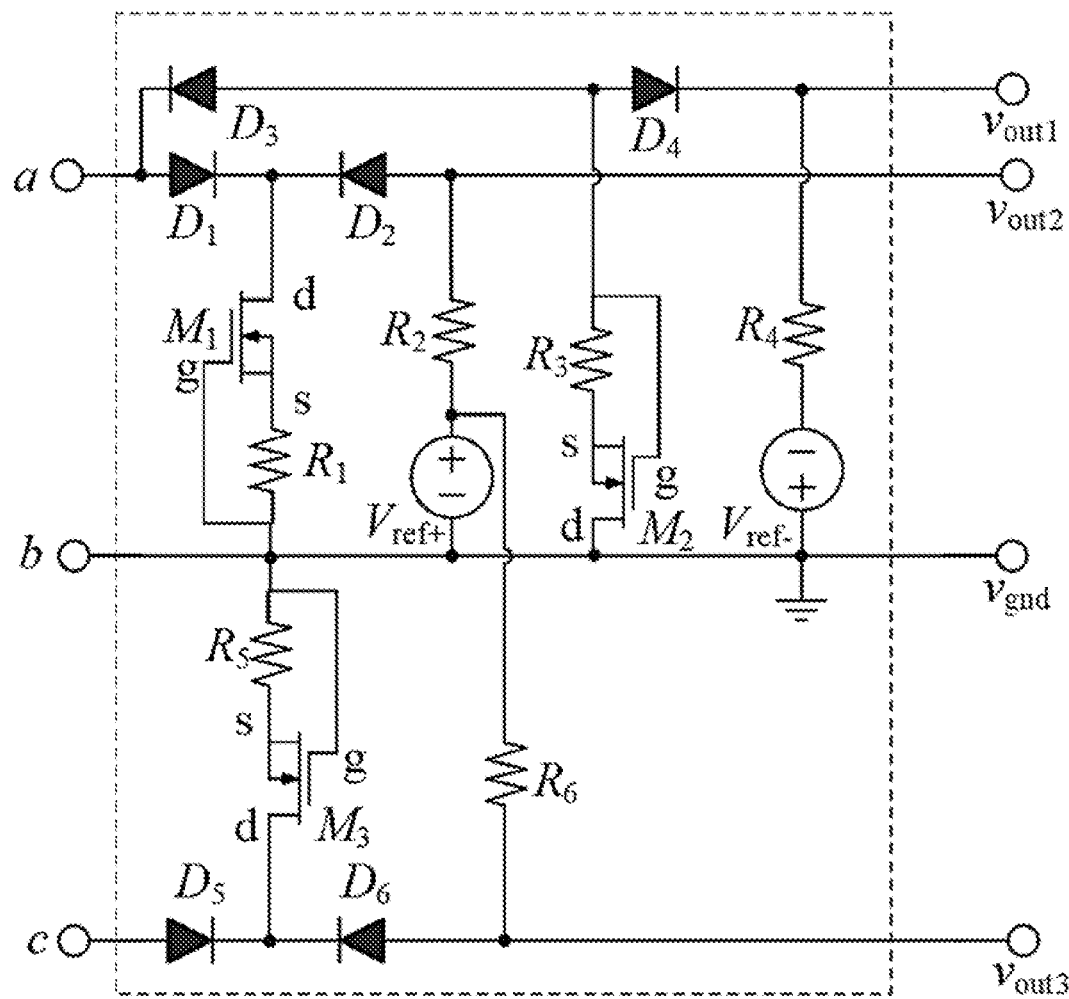
Figure 4C:
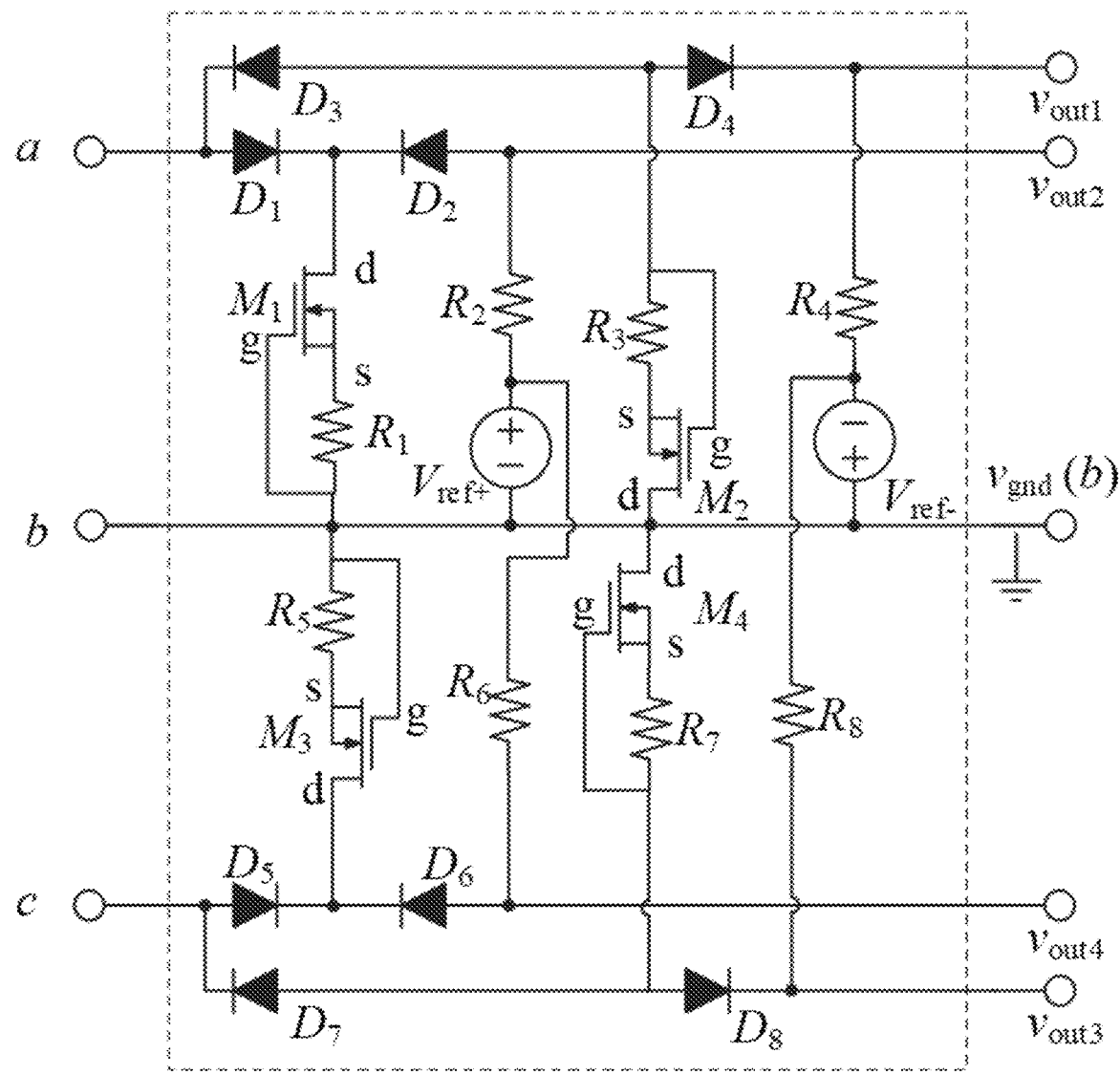

FIGS. 4a-4c illustrate various examples of electric circuit designs, where all have in common that the circuits are based on a reference voltages Vref+, Vref– applied from a reference voltage source.

FIG. 4a shows an electric circuit embodiment with input terminals a, b and c suitable for connection to the three phase output of a power device PWD as the one referred to in FIG. 1. The on-state voltages of switches T1-T6, referring to FIG. 1, can be obtained from the output terminals vout1 and vout2 of the circuit. When switch S1 is connected to terminal a, switches T1-T4 can be monitored, and when switch S1 is connected to terminal c, switches T3-T6 can be monitored. Apart from the reference voltages Vref+, Vref–, the circuit is simple, since it is based only on high voltage blocking diodes D1-D4, as well as resistors R1-R4, and two signal MOSFETs M1, M2.

FIG. 4b show a variant of the circuit of FIG. 4a, where the switch S1 is removed. Two extra diodes D5, D6, two extra resistors R5, R6, and one extra signal MOSFET M3 are added. By this configuration, all switches T1-T6, except for the IGBT chip in T6 and the diode chip in T5 which cannot be monitored.

FIG. 4c shows a variant of the circuit of FIG. 4b, where extra two diodes D7, D8, two extra resistors R7, R8, and one signal MOSFET M4 are added. By using this variant topology, all switches T1-T6 of the power device PWD of FIG. 1 can be monitored.

Figure 5:
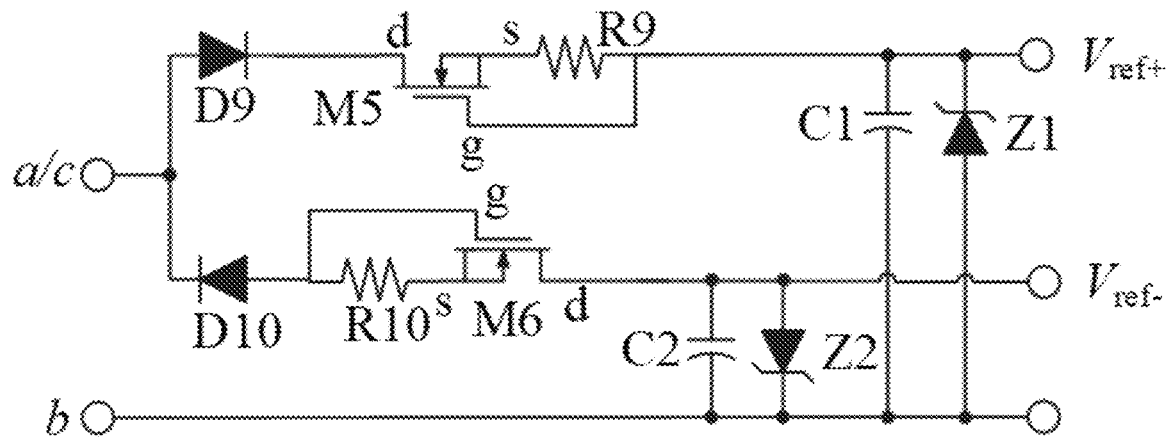
FIGS. 5 and 6 illustrate self-powered circuit diagrams for front-end device embodiments eliminating the need for an external reference voltage source.

FIGS. 5 shows an example of the use of zener diodes Z1, Z2 selected with zener voltages exceeding the expected on-state voltage level to be measured. Further two MOSFETs M5, M6, two resistors R9, R10, two diodes D9, D10 as well as two capacitors C1, C2 are used to provide a self-powered reference voltage providing the reference voltages Vref+, Vref– required for any of the embodiments shown in FIGS. 4a-4c.

Figure 6:
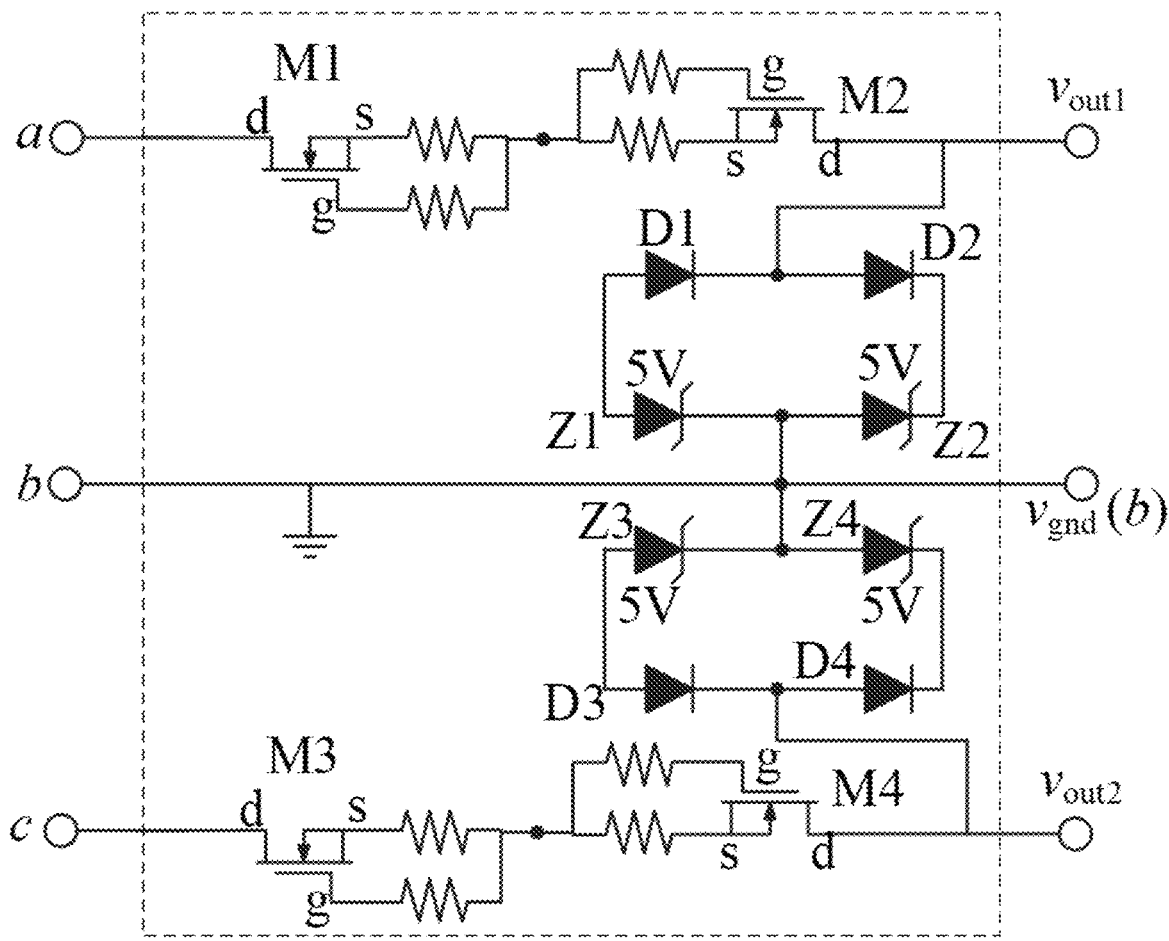

FIG. 6 illustrates an electric circuit embodiment which is self-powered, and thus eliminated the need for a reference voltage source. In this specific embodiment, four zener diodes Z1-Z4 serve to provide the necessary reference voltages. Further, four diodes D1-D4 and four signal MOSFETs M1-M4 each with two resistors are required. The MOSFETs exhibit different impedance by controlling their source resistors and the gate resistors. Zener diodes Z1 and Z2, to be selected to have a zener voltage larger than the maximum on-state voltage to be measured, can e.g. be selected to be 5 V.

When the input voltage at terminals a, b exceeds the zener voltage, a negative voltage drop will case M1 to provide a high impedance, so that only a very low current is allowed to flow. While anti-parallel body diode of M2 and D2 is conducted, causing the voltage across Z2 to retain at 5 V. Thus, the voltage vout will hereby be the zener voltage (e.g. 5 V) plus the forward voltage of diodes D1 or D2.

When the input voltage at terminals a, b is lower than minus the zener voltage, the output voltage will be minus the zener voltage minus the forward voltage of the forward voltage of diodes D1 or D2.

When the input voltage at terminals a, b is between minus the zener voltage and plus the zener voltage (e.g. between −5 V and +5 V), diodes D1, D2, Z1, Z2 are all blocked and the MOSFETs M1, M2 are in turn-on. In this situation, the output voltage vout will be equal to the input voltage across terminals a and b. Thus, any high voltage component is blocked from reaching the output terminals vout1, vout2, while a low voltage within minus to plus the selected zener voltage is passed to the output terminals vout1, vout2, thus allowing an on-state voltage to be measured. One terminal vgnd is reference ground.

Note that the diodes D1 and D2 do not need to be high voltage blocking diodes, because the positive high voltage and negative high voltage are blocked by M1 and M2 respectively. D1 and D2 are used to protect Z1 and Z2 from forward conduction.

Figure 7:
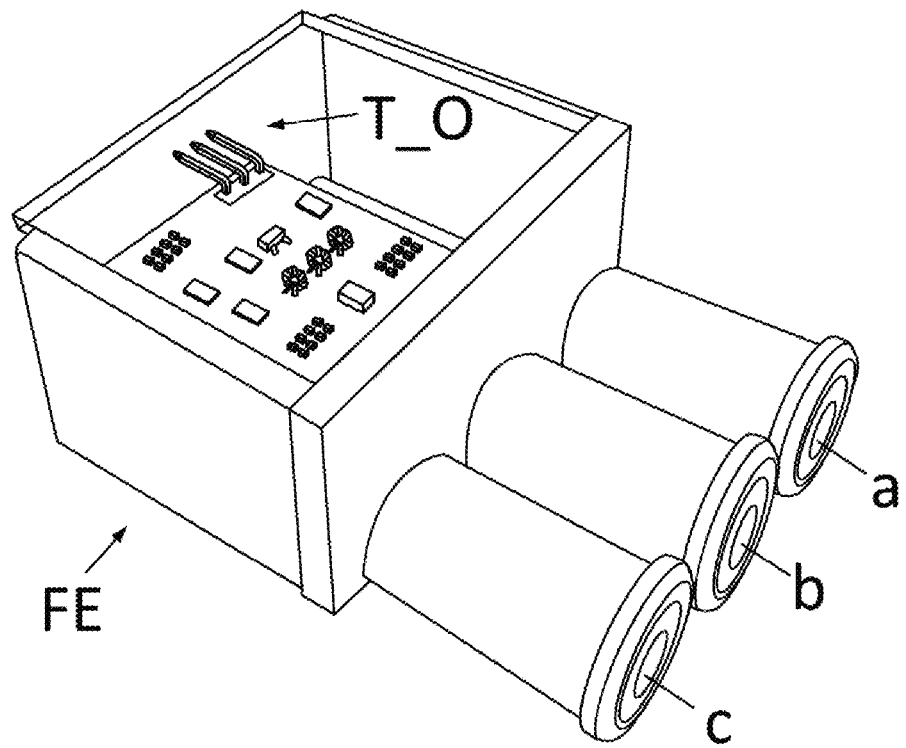
FIG. 7 illustrates a photo of a front-end device prototype.

FIG. 7 illustrates a photo of a front-end device FE prototype with three input terminals a, b, c arranged for connection to the three-phases of output terminals of a three-phase power device. In the prototype, all required electric circuits are implemented on one single printed circuit board arranged within a housing and with a three pin output terminal T_O, e.g. two pins configured to output respective output signals, and one pin to be used as reference ground terminal.

Figure 8:
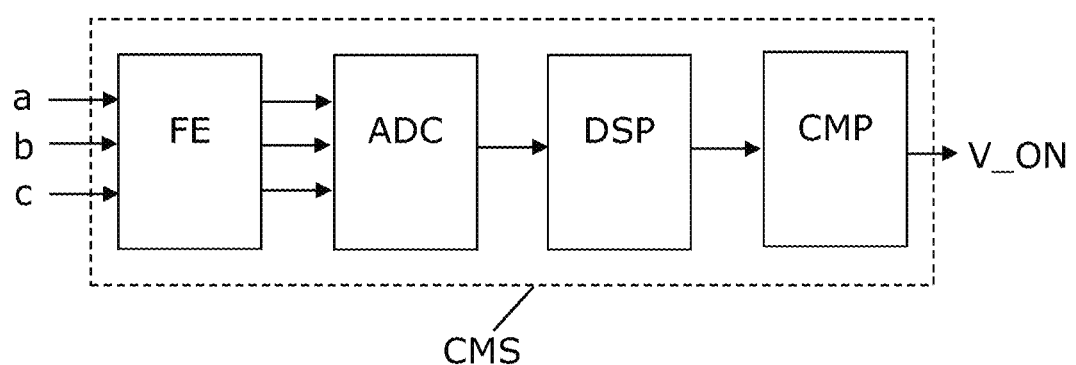
FIG. 8 illustrates a block diagram of a condition monitoring system embodiment.

FIG. 8 illustrates a block diagram of a condition monitoring system embodiment CMS. A front-end device FE has input terminals a, b, c, for connection to respective output terminals of a three-phase power device. Three output terminals from the front-end device FE are applied to an analog-to-digital converter ADC, e.g. a 14 bit analog-to-digital converter, which outputs three digital signals according to the three-phase output voltages of the front-end device FE output. A signal processor DSP programmed to process the three-phase voltages extracts the on-state voltages based on the received time signals. The output from the signal processor DSP is output to a computer or tablet or the like CMP which can make an output of the detected on-state voltages V_ON accordingly.

It is to be understood that the above described system elements FE, ADC, DSP, CMP can be combined or integrated in various ways, depending on whether to be suited for portable stand-alone test equipment, or to function as a permanently installed monitoring system at least partly integrated with the electric power device being monitored.

In an alternative to the embodiment shown in FIG. 8, the output signals from the front-end device can be applied to an ADC (could be in the forms of data acquisition system, oscilloscope, etc.), then to a computer, without a DSP in between.

In order to use the obtained on-state voltage V_ON in a computer or elsewhere for health condition monitoring, further steps are preferably performed. E.g. to estimate the junction temperature or degradation level of a power device. Such further steps include e.g. data processing, modelling, and calibration.

Figure 9:
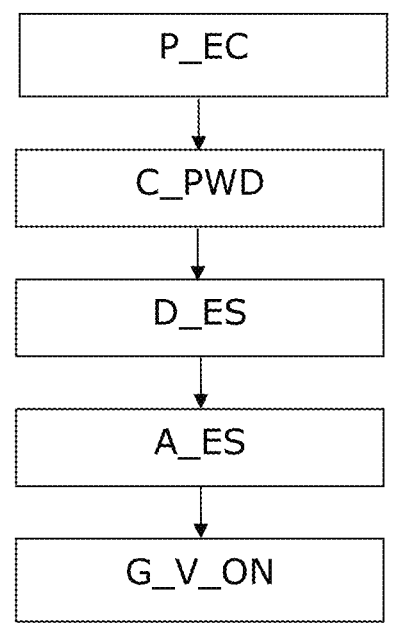
FIG. 9 illustrates steps of a method embodiment.

FIG. 9 illustrates steps of an embodiment of a method for determining on-state voltage of a semiconductor power switch of an associated power device. First, providing P_EC an electric circuit comprising at least two input terminals connected to a plurality of interconnected passive electric semiconductor switches and diodes further connected to the at least two output terminals, wherein the electric circuit serves to block a high voltage at the at least two input terminals from reaching the at least two output terminals. Next, connecting C_PWD the at least two input terminals to at least one phase of an electric output of the associated power device. Further, detecting D_ES electric signals at the at least two output terminals by means of a voltage measurement device. Further, analysing A_ES the electric signals at the at least two output terminals. Finally, generating G_V_ON, based on the analysis, an output to a user indicative of on-state voltage of at least one semiconductor power switch of the associated electric power device. The output can be provided directly as a number to the user, but it may be in the form of a graphical output indicating the evolution of measured on-state voltages for the power device over time. Further, the method may comprise generating an alarm to the user, in case the detected on-state voltage is abnormal, e.g. exceeds a preset threshold value.

Especially, the method is applicable for on-state voltages of IGBTs, MOSFETs or forward voltage of free-wheeling diodes, e.g. in a power device comprising an electric power converter. Preferably, the on-state voltage is measured with a mV precision to allow evaluation of any evolution from a basic level within the typical range of such as 1-3 V.

Figure 10A:
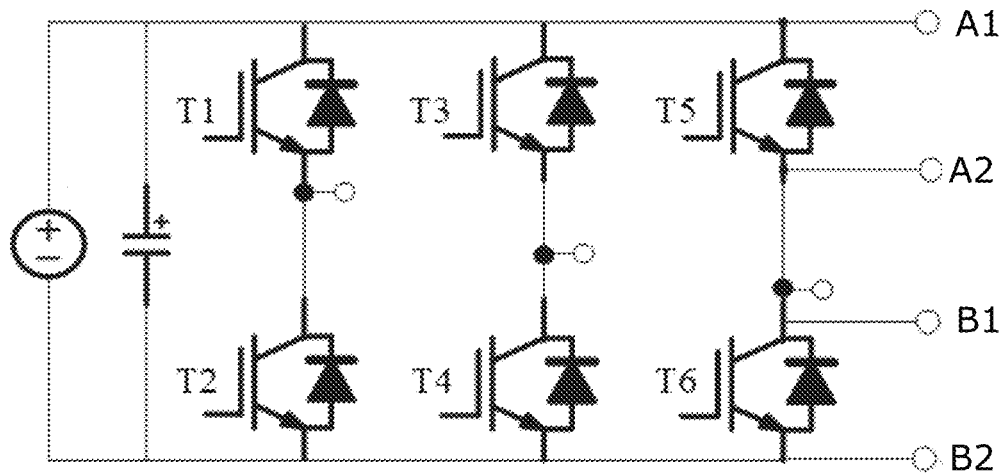
FIGS. 10a-10c show circuit diagrams for embodiments for on-state voltage measurements of single semiconductor switches.
Figure 10B:
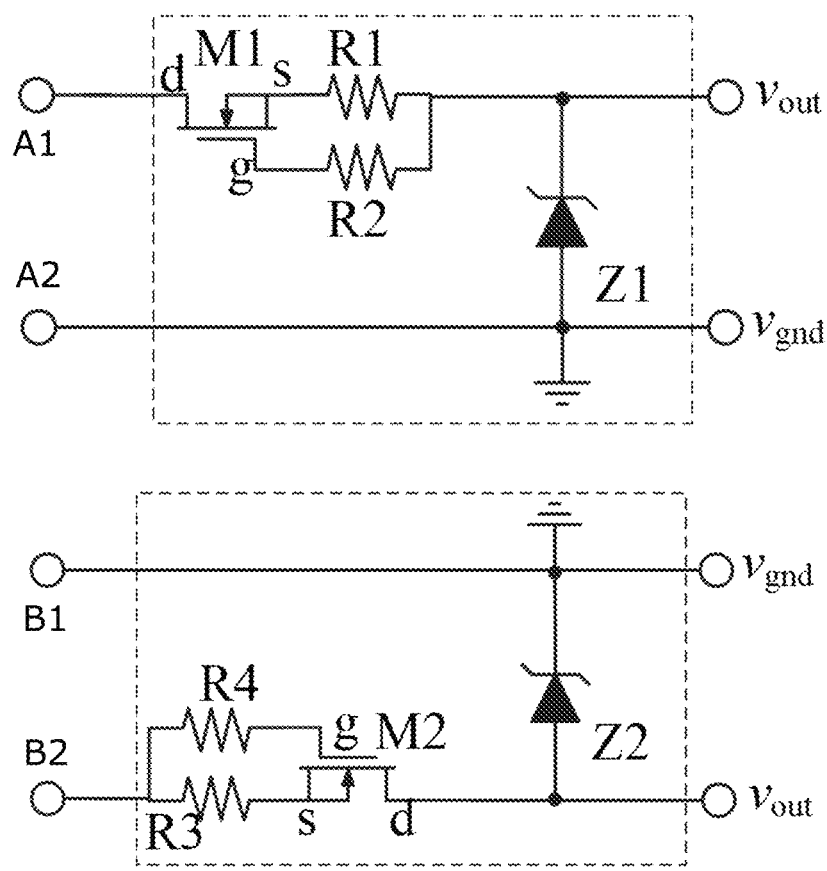
Figure 10C:
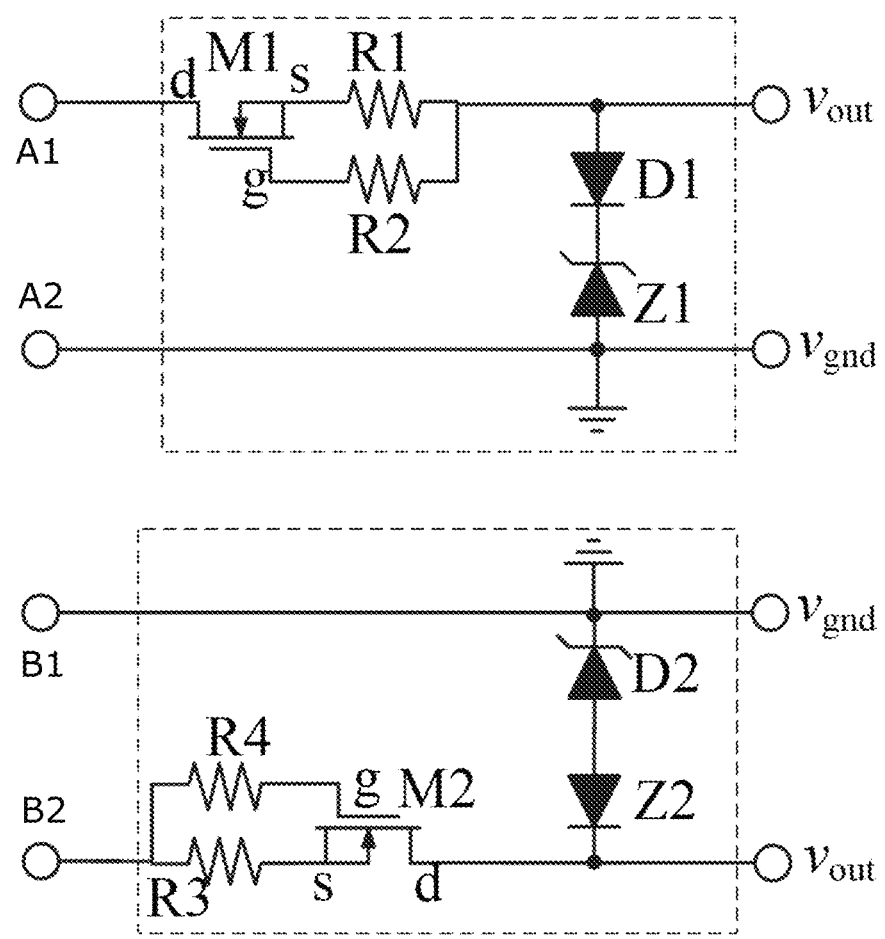

FIGS. 10a-10c illustrate embodiments for circuit that can measure on-state voltage of single semiconductor switches and diodes in an electric power device. E.g. for an electric power device with built-in circuits for on-state voltage measurements.

FIG. 10a shows, as an example, the same three-phase electric power device as in FIG. 1, namely with three sets of semiconductor switches T1-T6, e.g. IGBTs. However, in FIG. 10a, the switch T5 is accessible via terminals A1, A2, and switch T5 is accessible via terminals B1, B2.

FIG. 10b shows examples of circuits for connection to the terminals A1, A2, B1, B2 of the electric power device in FIG. 10a and which are capable of determining on-state voltages of the switches T5 and T6, by means of semiconductor switches M1, M2 and zener diodes Z1, Z2, as well as resistors R1-R4, following the principles explained in the foregoing. Thus, the zener diodes Z1, Z2 should be selected to have zener voltages exceeding the expected range of the on-state voltages to be measured at output terminals vout and vgnd. Especially, a zener voltage of such as 2-5 V may be selected. The semiconductor switches M1, M2 serve to block high voltage components.

FIG. 10c shows examples of circuits for connection to the terminals A1, A2, B1, B2 in FIG. 10a and which are capable of determining on-state voltages of the switches T5 and T6 as well as the forward voltage of the free wheeling diodes of the IGBTs T5, T6. Further to the embodiment in FIG. 10b, diodes D1, D2 are required, also following the description in the foregoing.

Following FIGS. 10a-10c, a special front-end device embodiment for monitoring operation of an associated electric power device with semiconductor power switches generating a power output with at least one electric phase, the front-end device comprising
  at least two input terminals arranged for connection across
    at least one semiconductor power switch of the associated electric power device,
  at least two output terminals, and
  an electric circuit connected between the at least two input terminals and the at least two output terminals, wherein the electric circuit comprises an interconnection comprising an electric semiconductor switch and a zener diode, wherein the electric circuit serves to electrically block any high voltage component from reaching the at least two output terminals, while allowing an on-state voltage of the at least one semiconductor power switch in the associated electric power device to pass to the at least two output terminals, wherein the zener diode has a zener voltage exceeding the expected on-state voltage of the semiconductor power switch, and especially the electric semiconductor switch serves to block high voltage components from reaching the output terminals.

Still further, in a further special embodiment, an electric power device with semiconductor power switches generating a power output with at least one electric phase further comprises the just mentioned special front-end device embodiment. Especially, the special front-end device embodiment may be built into the electric power device, e.g. so that only output terminals of the front-end device are accessible from outside the electric power device housing rather than terminals providing access across the semiconductor switches directly. It is to be understood that the front-end device embodiment may comprise circuits and output terminals to allow determination of on-state voltages of a plurality of semiconductor power switches of the electric power device. In this way, an electric power device is provided with a few simple extra components that provide on-state voltage measurements of single semiconductor switches, thereby allowing an effective and low cost health condition monitoring of the electric power device.

Figure 11A:
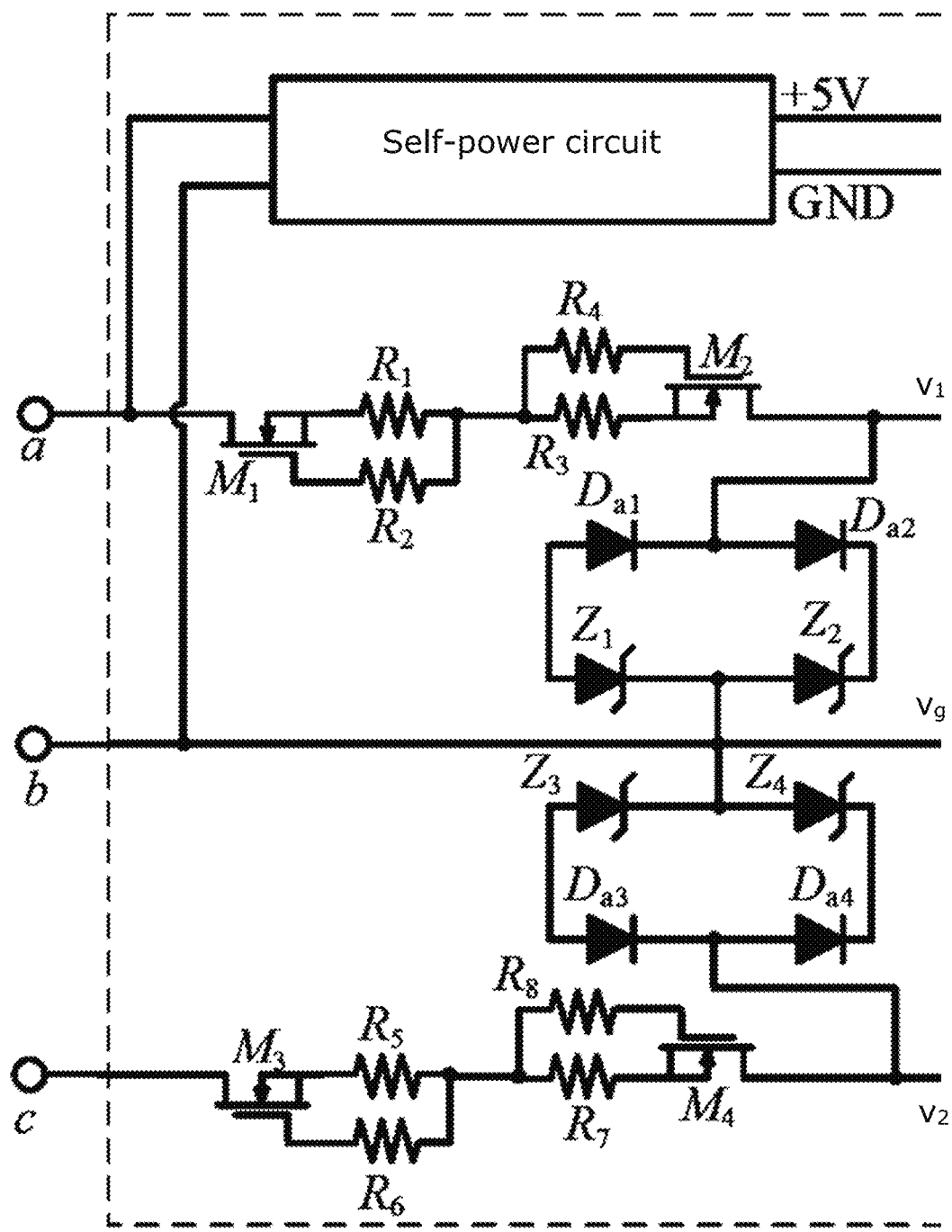
FIGS. 11a and 11b illustrate a diagram of a condition monitoring system embodiment with self-powering and galvanic isolation.
Figure 11B:
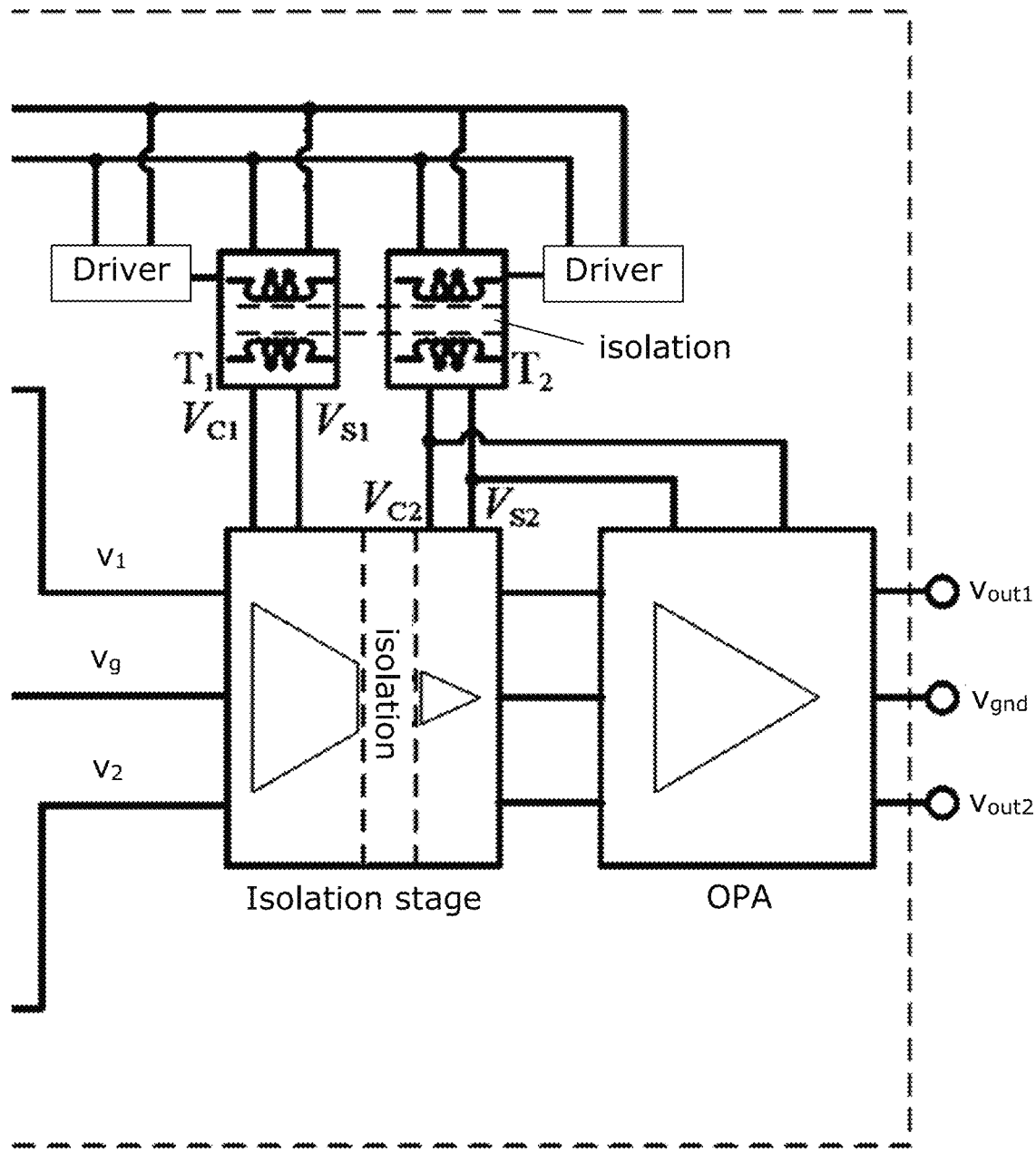

FIGS. 11a and 11b illustrate a block diagram, split into the two figures, of a specific condition monitoring system three-phase embodiment with a self-power circuit and galvanic isolation. As an example, the condition monitoring system can be applied for on-state voltage measurement of a three-phase inverter.

Figure 12:
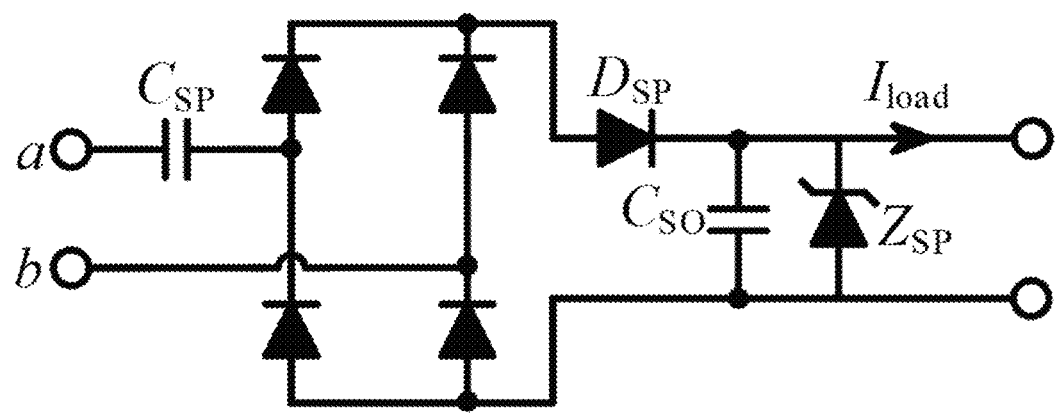
FIG. 12 illustrates a circuit diagram of a self-powering circuit, e.g. for use with the embodiment of FIGS. 11a and 11b.

For many applications, a galvanic isolation implementation is required for a condition monitoring system. FIGS. 11a and 11b show an example of such implementation. FIG. 12 shows a specific example of a low-voltage self-power circuit (e.g. 5 V or 12 V) for the system of FIGS. 11a and 11b.

With the galvanic isolation capability and the self-power circuit, the on-state voltage measurement circuit is extended to include three parts: a self-power circuit, and an on-state voltage measurement stage, both shown in FIG. 11a, and further an isolation stage shown in FIG. 11b.

Power is extracted from the input terminals a and b (could also be b and c or a and c), which are the middle-points of two phase-legs. As such, it retains the plug-and-play feature without the need of any additional power supply. In a specific implementation, a galvanic isolation of 5 kVrms may be realized, however the self-power method is applicable to other galvanic isolation requirements.

The on-state voltage measurement stage in FIG. 11a is capable of measuring the on-state voltages of six power switches and six diodes in a three-phase inverter. The measured results are included in two output signals only. As seen the on-state voltage measurement stage is comparable with the one shown and explain in connection with FIG. 6.

The isolation stage in FIG. 11b implements a galvanic isolation through an isolated amplifier. By combining with the operational amplifier OPA, the on-state voltages after isolation can be proportionally transformed into their original values or a proper range. Their power supply comes from the self-power circuit through two isolated transformers $T_1$ and $T_2$. $V_{C1}$ is for the first-side power supply and $V_{C2}$ is for the second-side power supply.

FIG. 12 illustrates an example of a preferred low voltage self-power circuit, e.g. for use with the embodiment shown in FIGS. 11a and 11b. Capacitor $C_{SP}$ is a high-voltage capacitor to block the possible high-voltage across the terminals a and b. The passive diode-based rectifier is used to transform the bipolar input voltage into a unipolar positive voltage. Diode $D_{SP}$ is for protection, capacitor $C_{SO}$ is for energy storage, and zener diode $Z_{SP}$ is arranged to clamp the required output voltage to a desired low voltage level, e.g. 5 V or 12 V or the like.

It is known that output voltage, e.g. voltage between terminals a and b (or between terminals c and b, referring to FIG. 11a) in case of a three-level inverter includes a bipolar DC-link voltage and on-state voltages of power devices. Therefore, according to the status of the voltage between terminals a and b the self-power circuit has two operational modes:

1. A dynamic mode, when the input voltage at input terminals a, b is changed from the low on-state voltage to $\pm V_{DC}$, or reversely, $C_{SP}$ is in charging or discharging and $C_{SO}$ keeps in charging status, which can be given by:

$$C_{SP}\frac{dV_{DC}}{dt_{on/off}} = C_{SO}\frac{dV_Z}{dt_{on/off}} + I_{load}$$

where $t_{on/off}$ is the turn-on/off time of the power switches. $V_Z$ is the Zener voltage of $Z_{SP}$. $I_{load}$ is the current required by the isolation stage, which can be known from the datasheet of applied IC chips. Thus, for a given case study, $V_{DC}$, $V_Z$, $t_{on/off}$, and $I_{load}$ can be confirmed. Then, $C_{SP}$ and $C_{SO}$ can be selected. The design principle is to ensure that the voltage across $C_{SO}$ can be increased to $V_Z$ during $t_{on}$ or $t_{off}$.

2. A static mode, when the input voltage at input terminals a,b is in $V_{DC}$ or the low on-state voltage, there is no current flowing through $C_{SP}$ and the discharge of $C_{SO}$ can be given by:

$$C_{SO}\frac{dV_Z}{dt_{con}} = I_{load}$$

where $t_{con}$ is the conduction time of power switches. If $C_{SO}$ is large enough, the decrease of $V_Z$ during $t_{con}$ can be neglected. $C_{SP}$ and $C_{SO}$ are selected according to specific case studies, such that the self-power circuit can provide the required power consumption for the isolation stage.

The condition monitoring system of FIGS. 11a, 11b and 12 has been tested in an experimental setup, and it has been confirmed that on-state voltages can be measured without any external power supply.

In relation to the embodiments of FIG. 11a, 11b and FIG. 12, it should be noted that the application of the self-power method is not limited to galvanic isolation, and if used for the power supply for a galvanic isolation, it is not limited to the specific galvanic isolation solution described. Further, the application of the self-power method is not limited to the three-phase inverter application, which can also be applied for the on-state voltage measurement circuits for a single-phase inverter, a half-bridge leg, or a single switch or the like.

To sum up, the invention provides a front-end device for monitoring operation of an associated electric power device with semiconductor power switches generating a power output, e.g. a three-phase power output. The front-end device has input terminals arranged for connection to the electric phase(s) of the power output of the associated electric power device, and an electric circuit connected to the input terminals and connected to a set of output terminals. The electric circuit has a passive interconnection comprising electric semiconductor switches and diodes. The electric circuit serves to electrically block any high voltage component from the input terminals from reaching the output terminals, while allowing an on-state voltage of at least one semiconductor power switch in the associated electric power device to pass to the at least two output terminals. The front-end allows low voltage equipment to be connected to its output terminals for determining an on-state voltage of switches of the electric power device. Especially, embodiments with self-powered reference voltage circuits provided by zener diodes allow compact low cost versions for use in e.g. portable test equipment or as part of permanently installed health condition monitoring of power devices. The front-end device can be used as a simple and low cost solution for non-invasive health condition monitoring of power devices, e.g. power converters in such as power electric generation system or electric vehicles. Such monitoring allows predictive maintenance to be performed to avoid any faults in the power device that may cause permanent damages.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A front-end device for monitoring operation of an associated electric power device with semiconductor power switches generating a power output with at least one electric phase, the front-end device comprising
   at least three input terminals arranged for connection to respective three electric phases of the power output of the associated electric power device,
   at least two or three output terminals, and
   an electric circuit connected between the at least three input terminals and the at least two or three output terminals, wherein the electric circuit comprises an interconnection comprising electric semiconductor switches and diodes, wherein the electric circuit serves to electrically block any high voltage component from reaching the at least two or three output terminals, while allowing an on-state voltage of at least one semiconductor power switch in the associated electric power device to pass to the at least two or three output terminals in order to allow determining on-state voltages for each of the three electric phases of the power output of the associated electric power device.

2. The front-end device according to claim 1, comprising a pair of diodes serving to electrically block high voltage from reaching the at least two output terminals.

3. The front-end device according to claim 1, comprising at least one zener diode with a zener voltage exceeding an expected on-state voltage of said semiconductor power switch.

4. The front-end device according to claim 3, wherein a zener diode is connected as part of a self-power circuit for connection to at least two of the at least two input terminals.

5. The front-end device according to claim 4, wherein the self-power circuit comprises a high-voltage blocking capacitor connected at an input to a diode-based rectifier, and wherein the zener diode is connected between output terminals of the self-power circuit in parallel with a capacitor.

6. The front-end device according to claim 5, wherein the self-power circuit has a first mode of operation wherein the capacitor in parallel with the zener diode is in a charging stage, when a voltage at the input terminals of the self-power circuit is changed from the on-state voltage to plus or minus a high DC voltage.

7. The front-end device according to claim 6, wherein the self-power circuit has a second mode of operation wherein the capacitor in parallel with the zener diode is in a discharging stage, when a voltage at the input terminals of the self-power circuit is either the on-state voltage or at a high DC voltage.

8. The front-end device according to claim 1, further comprising a galvanic isolation stage to allow galvanic isolation between the at least two input terminals and the at least two output terminals, and a self-power circuit connected to two of the at least two input terminals, wherein the galvanic isolation stage comprises an isolated amplifier connected between an output of an on-state voltage measurement stage and the at least two output terminals, and wherein the self-power circuit is connected to provide electric power for powering the isolated amplifier via at least one transformer.

9. A condition monitoring system for monitoring operation of an associated electric power device with semiconductor power switches generating a power output with at least three electric phases, the system comprising
   a front-end device according to claim 1, and
   an analysis system comprising a processor system and being arranged for connection to the at least two or three output terminals of the front-end device, and further being arranged to determine on-state voltage levels of at least one semiconductor power switch for each of the three electric phases in the associated electric power device in response to electric signals measured at the at least two or three output terminals of the frond end device, and to generate an output indicative of said on-state voltage levels accordingly.

10. The condition monitoring system according to claim 9, comprising at least one analog-to-digital converter connected to the at least two output terminals of the frond-end device, and being arranged to generate a digital output signal in accordance with a voltage across the at least two output terminals.

11. The condition monitoring system according to claim 9, wherein the analysis system is arranged to monitor at least one on-state voltage level over time for the associated electric power device.

12. The condition monitoring system according to claim 9, being implemented; as a portable equipment, as a system arranged for installation for continuous monitoring of the associated electric power device, with the front-end device integrated into the associated electric power device, or being implemented with at least part of the analysis system being integrated with a system generating or receiving electric power from the associated electric power device.

13. The condition monitoring system according to claim 9, further comprising at least three input terminals arranged for connection to respective three electric phases of the power output of the associated electric power device, at least two or three output terminals, and an electric circuit connected between the at least three input terminals and the two or three output terminals, wherein the electric circuit comprises an interconnection comprising electric semiconductor switches and diodes, wherein the electric circuit serves to electrically block any high voltage component from reaching the two or three output terminals, while allowing an on-state voltage of at least one semiconductor power switch in the associated electric power device to pass to the two or three output terminals in order to allow determining on-state voltages for each of the three electric phases of the power output of the associated electric power device, wherein the condition monitoring system is arranged to determine an on-state voltage level of at least one semiconductor power switch for each of the three electric phases of the associated electric power device in response to electric signals measured at the two or three output terminals of the frond-end device, and wherein the analysis system is arranged to generate an output indicative of said on-state voltage levels accordingly.

14. A system comprising
an electric power device comprising a power output with at least three electric phases,
the front-end device according to claim 1, wherein the at least three input terminals are connected to respective three electric phases of power outputs of the electric power device.

15. The system according to claim 14 further comprising a condition monitoring system for monitoring operation of an associated electric power device with semiconductor power switches generating a power output with at least one electric phase, the system comprising: an analysis system comprising a processor system and being arranged for connection to the at least two output terminals of the front-end device, and further being arranged to determine an on-state voltage level of at least one semiconductor power switch in the associated electric power device in response to electric signals measured at the at least two output terminals of the frond-end device, and to generate an output indicative of said on-state voltage level accordingly.

16. The system according to claim 14 being one of: an electric vehicle, a power generation system, an electric motor drive system, a traction motor system, an aircraft.

17. A method for determining on-state voltage of a semiconductor power switches of an associated three-phase power device, the method comprising
providing an electric circuit comprising three input terminals connected to a plurality of interconnected electric semiconductor switches and diodes further connected to the at least two output terminals, wherein the electric circuit serves to block a high voltage at the three input terminals from reaching the at least two output terminals,
connecting the three input terminals to respective phases of the three-phase electric outputs of the associated power device,
detecting electric signals at the at least two output terminals,
analysing the electric signals at the at least two output terminals,
generating, based on the analysis, an output to a user indicative of on-state voltages of semiconductor power switches for each of the three phases of the associated electric three-phase power device.

* * * * *